(12) United States Patent
Mei et al.

(10) Patent No.: US 11,825,607 B2
(45) Date of Patent: Nov. 21, 2023

(54) PACKAGE SUBSTRATE MANUFACTURING METHOD

(71) Applicant: MONTAGE TECHNOLOGY (KUNSHAN) CO., LTD., Jiangsu (CN)

(72) Inventors: Meng Mei, Suzhou (CN); Gang Shi, Suzhou (CN); Peichun Wang, Suzhou (CN); Guangfeng Li, Suzhou (CN)

(73) Assignee: MONTAGE TECHNOLOGY (KUNSHAN) CO., LTD., Jiangsu (CN)

( * ) Notice: Subject to any disclaimer, the term of this patent is extended or adjusted under 35 U.S.C. 154(b) by 25 days.

(21) Appl. No.: 17/258,900

(22) PCT Filed: May 15, 2020

(86) PCT No.: PCT/CN2020/090698
§ 371 (c)(1),
(2) Date: Jan. 8, 2021

(87) PCT Pub. No.: WO2021/196359
PCT Pub. Date: Oct. 7, 2021

(65) Prior Publication Data
US 2022/0141962 A1 May 5, 2022

(30) Foreign Application Priority Data

Apr. 1, 2020 (CN) .......................... 202010251543.6

(51) Int. Cl.
*H05K 3/00* (2006.01)
*H05K 1/03* (2006.01)
*H05K 3/06* (2006.01)

(52) U.S. Cl.
CPC ......... *H05K 3/0044* (2013.01); *H05K 1/0306* (2013.01); *H05K 1/0366* (2013.01);
(Continued)

(58) Field of Classification Search
CPC .... H05K 1/024; H05K 1/0306; H05K 1/0366; H05K 2201/029; H05K 3/0011;
(Continued)

(56) References Cited

U.S. PATENT DOCUMENTS 5,837,624 A * 11/1998 Sakaguchi ........... H05K 1/0366
442/232
6,277,771 B1 * 8/2001 Nishimura ........... D03D 15/573
442/256
(Continued)

FOREIGN PATENT DOCUMENTS

CN 101861052 A 10/2010
CN 109390315 A 2/2019

OTHER PUBLICATIONS

Jun. 1, 2023 Office Action issued in Chinese Patent Application No. 202010251543.6.
(Continued)

*Primary Examiner* — Minh N Trinh
(74) *Attorney, Agent, or Firm* — Oliff PLC

(57) ABSTRACT

A manufacturing method for a package substrate, the method including: forming a package substrate by a first dielectric layer formed by weaving at least fiberglass of a first width and a second dielectric layer formed by weaving at least fiberglass of a second width. The second width is different from the first width, and the weaving direction of the fiberglass in the first dielectric layer is 90° relative to the weaving direction of the fiberglass in the second dielectric layer.

7 Claims, 2 Drawing Sheets

(52) U.S. Cl.
CPC ............. *H05K 3/0011* (2013.01); *H05K 3/06* (2013.01); *H05K 2201/029* (2013.01)

(58) Field of Classification Search
CPC ...... H05K 3/0044; H05K 3/06; H05K 3/4626; D03D 13/00
See application file for complete search history.

(56) References Cited

U.S. PATENT DOCUMENTS

| | | | | |
|---|---|---|---|---|
| 2014/0158406 | A1* | 6/2014 | Kato | H05K 1/024 174/250 |
| 2016/0007452 | A1* | 1/2016 | Yan | C03C 25/30 442/64 |
| 2017/0064818 | A1* | 3/2017 | Kim | H05K 1/0271 |
| 2019/0053371 | A1* | 2/2019 | Yang | H01L 23/5384 |
| 2022/0141962 | A1* | 5/2022 | Mei | D03D 15/267 174/250 |

OTHER PUBLICATIONS

Jul. 20, 2023 Office Action issued in Chinese Patent Application No. 202010251543.6.

Aug. 24, 2023 Office Action issued in Chinese Patent Application No. 202010251543.6.

* cited by examiner

PACKAGE SUBSTRATE MANUFACTURING METHOD

FIELD

The present invention generally relates to package technology field, and particularly relates to a package substrate and manufacturing method thereof.

BACKGROUND

For package substrates made of PPG (Pre-preg) material, its dielectric layer is based on woven fiberglass and formed by wrapping the woven fiberglass with epoxy resin. Dielectric constant of the dielectric layer is the equivalent dielectric constant of the fiberglass and the epoxy resin integrated together. As width of signal transmission lines of the package substrate becomes narrower and narrower, the signal transmission lines can no longer cover more than two clusters of fiberglass. As a result, the equivalent dielectric constants of the dielectric layers on both of up and down sides will be very different when the signal transmission lines of the package substrate are 0° or 90° along the fiberglass weaving direction, resulting in signal integrity problem of the signal transmission lines, which is called as transmission line weaving effect.

However, as system architecture becomes more and more complex and the signal rate becomes higher and higher, the signal integrity of the high-speed signal transmission line becomes more important. Therefore, there is a need to provide an improved package substrate and a manufacturing method thereof.

SUMMARY

The purpose of the present invention is to provide a package substrate and a manufacturing method thereof to solve the problem of weaving effect in the prior art.

In one aspect, the present application provides a manufacturing method of a package substrate, comprising: forming a package substrate by a first dielectric layer formed by weaving at least fiberglass of a first width and a second dielectric layer formed by weaving at least fiberglass of a second width; wherein, the second width is different from the first width, and the weaving direction of the fiberglass in the first dielectric layer is 90° relative to the weaving direction of the fiberglass in the second dielectric layer.

In some embodiments, the first dielectric layer is formed by the following steps: forming a first woven fiberglass by weaving a first warp yarn and a first weft yarn, wherein the first warp yarn and the first weft yarn are fiberglass with the first width; forming the first dielectric layer by wrapping epoxy on both sides of the first woven fiberglass.

In some embodiments, the second dielectric layer is formed by the following steps: forming a second woven fiberglass by weaving a second warp yarn and a second weft yarn, wherein the second warp yarn and the second weft yarn are fiberglass with the second width; forming the second dielectric layer by wrapping epoxy on both sides of the second woven fiberglass.

In some embodiments, the first dielectric layer is formed by the following steps: forming a first woven fiberglass by weaving a first warp yarn and a first weft yarn, wherein the first warp yarn is fiberglass of the first width and the first weft yarn is fiberglass of a third width, or the first weft yarn is fiberglass of the first width and the first warp yarn is fiberglass of a third width, wherein the third width is different from the first width and the second width; forming the first dielectric layer by wrapping epoxy on both sides of the first woven fiberglass.

In some embodiments, the second dielectric layer is formed by the following steps: forming a second woven fiberglass by weaving a second warp yarn and a second weft yarn, wherein the second warp yarn is fiberglass of the second width and the second weft yarn is fiberglass of a fourth width, or the second weft yarn is fiberglass of the second width and the second warp yarn is fiberglass of a fourth width, wherein the fourth width is different from the first width, the second width, and the third width; forming the second dielectric layer by wrapping epoxy on both sides of the second woven fiberglass.

In some embodiments, the second width is greater than the first width.

In some embodiments, before the step of forming the package substrate, the method further comprises: marking the weaving direction of the corresponding fiberglass on the first dielectric layer and the second dielectric layer.

In some embodiments, before the step of forming the packaging substrate, the method further comprises: forming signal transmission lines on the first dielectric layer or the second dielectric layer, and the signal transmission lines are located between the first dielectric layer and the second dielectric layer.

In some embodiments, the transmission lines are copper wires, and the copper wires are formed by etch process on the first dielectric layer or the second dielectric layer.

In another aspect, the present application provides a package substrate, comprising: a first dielectric layer, formed by weaving at least fiberglass of a first width; a second dielectric layer, formed by weaving at least fiberglass of a second width; and signal transmission lines, the signal transmission lines are located between the first dielectric layer and the second dielectric layer; wherein, the second width is different from the first width, and the weaving direction of the fiberglass in the first dielectric layer is 90° relative to the weaving direction of the fiberglass in the second dielectric layer.

In some embodiments, the first dielectric layer comprises a first warp yarn weaving along latitude direction and a first weft yarn weaving along longitude direction, and the second dielectric layer comprises a second weft yarn weaving along the longitude direction and the second warp yarn weaving in the latitude direction, wherein the widths of the second warp yarn and/or the second weft yarn are different from the widths of the first warp yarn and/or the first weft yarn.

In another aspect, the present application also discloses a printed circuit board, comprising a package substrate formed by the method for manufacturing the package substrate as described above.

In this application, two adjacent dielectric layers use fiberglass of different widths, and the weaving directions of the fiberglass is rotated by 90°, which can increase covered area by the fiberglass in the package substrate, improve the integrity of the signal transmission lines, make heat distribution of the package substrate more uniform and reduce warpage.

BRIEF DESCRIPTION OF THE FIGURES

Non-limiting and non-exhaustive embodiments of the present application are described with reference to the following drawings, where like reference numerals refer to like parts throughout the various views unless otherwise specified.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Figure 1:
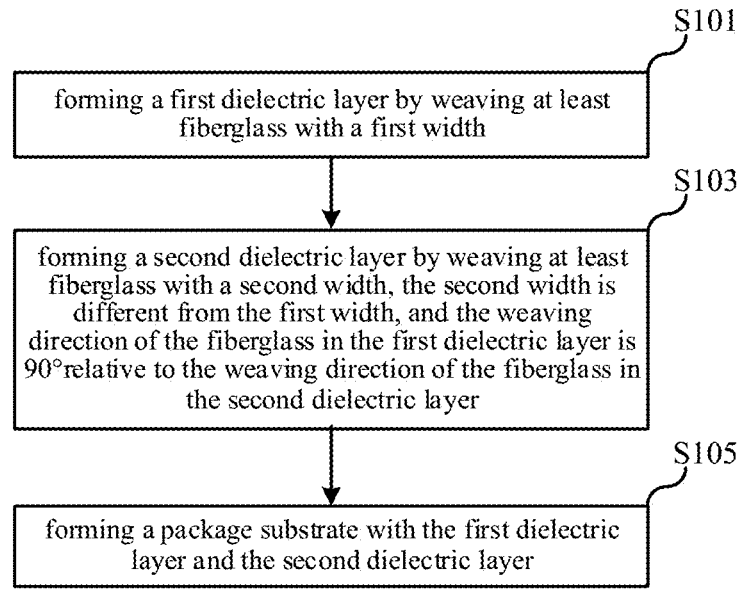
FIG. 1 shows a schematic flowchart of the manufacturing method according to an embodiment of the present application.

An embodiment of the present application discloses a manufacturing method of package substrate. FIG. 1 shows a flowchart of the manufacturing method of the package substrate. The method comprising:

Step S101, forming a first dielectric layer by weaving at least fiberglass of a first width.

Step S103, forming a second dielectric layer by weaving at least fiberglass of a second width, wherein the second width is different from the first width, and the weaving direction of the fiberglass in the first dielectric layer is 90° relative to the weaving direction of the fiberglass in the second dielectric layer.

Step S105, forming a package substrate with the first dielectric layer and the second dielectric layer.

Figure 2:
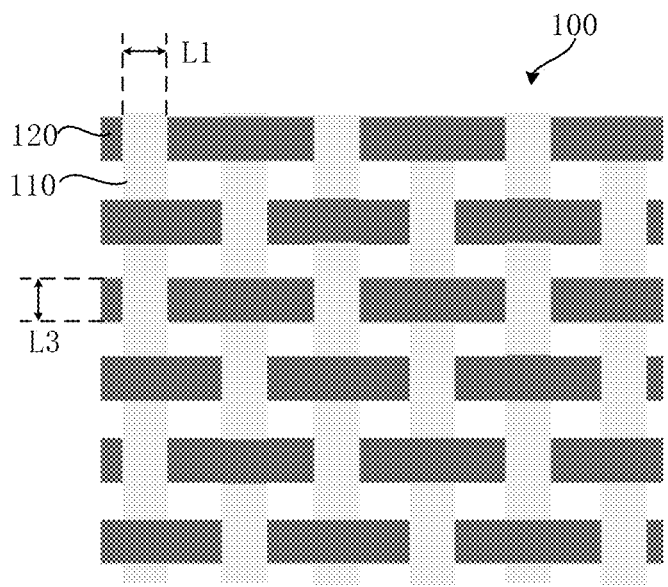
FIG. 2 shows a schematic diagram of a first dielectric layer according to an embodiment of the present application.

FIG. 2 shows a schematic diagram of a first dielectric layer 100 in an embodiment. The first dielectric layer 100 comprises a first woven fiberglass and epoxy resin (not shown). The first woven fiberglass comprises a first warp yarn 110 and a first weft yarn 120, and both the first warp yarn 110 and the first weft yarn 120 are fiberglass materials. In a preferred embodiment, the first dielectric layer 100 is formed by the following steps:

forming a first woven fiberglass with the first warp yarn 110 and the first weft yarn 120. In an embodiment, the first warp yarn 110 may be fiberglass of the first width L1, and the first weft yarn 120 may be fiberglass of a third width L3. In some embodiments, the first width L1 and the third width L3 are equal, that is, the first warp yarn and the first weft yarn have the same width.

After that, forming the first dielectric layer 100 by wrapping epoxy resin on both sides of the first woven fiberglass.

In some embodiments, the first width L1 may be different from the third width L3, that is, the first warp yarn and the first weft yarn may have different widths.

It should be understood that the first weft yarn 120 may be fiberglass of the first width L1, and the first warp yarn 110 may be fiberglass of the third width L3.

Figure 3:
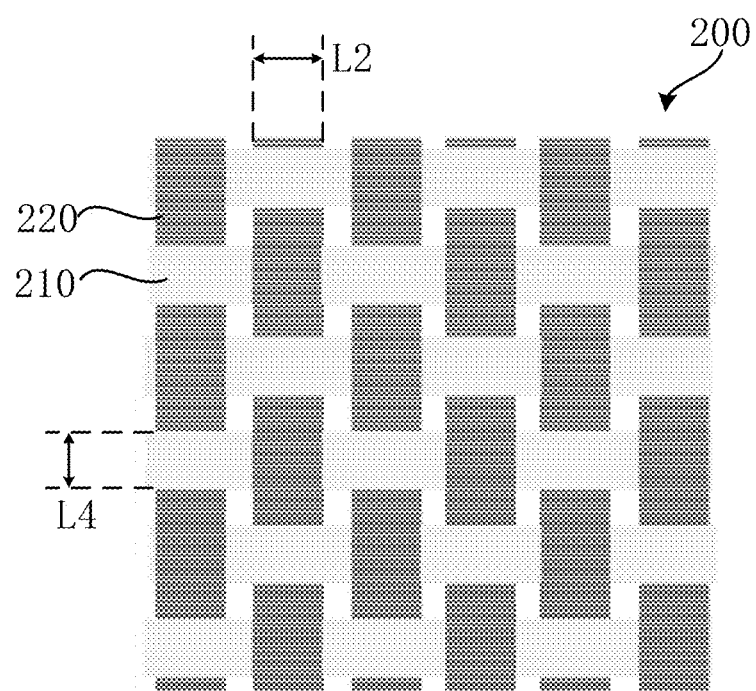
FIG. 3 shows a schematic diagram of a second dielectric layer according to an embodiment of the present application.

FIG. 3 shows a schematic diagram of a second dielectric layer 200 in an embodiment. The second dielectric layer 200 comprises a second woven fiberglass and epoxy resin (not shown), wherein, the second woven fiberglass comprises a second warp yarn 210 and a second weft yarn 220, and both the second warp yarn 210 and the second weft yarn 220 are fiberglass materials. In some embodiments, the second dielectric layer 200 is formed by the following steps:

forming a second woven fiberglass of a second warp yarn 210 and a second weft yarn 220;

forming the second dielectric layer 200 by wrapping epoxy resin on both sides of the second woven fiberglass. In some embodiments, the second warp yarn 210 may be fiberglass of the second width L2, and the second weft yarn 220 may be fiberglass of a fourth width L4. In addition, the second width L2 is different from the first width L1. For example, the second width L2 may be larger or smaller than the first width L1.

In some embodiments, the second width L2 and the fourth width L4 are equal, that is, the widths of the second warp yarn 210 and the second weft yarn 220 are different.

After that, forming the second dielectric layer 200 by wrapping epoxy resin on both sides of the second woven fiberglass.

In some embodiments, the fourth width L4 is different from the second width L2, that is, the second warp yarn 210 and the second weft yarn 220 have different widths.

It should be understood that the second weft yarn 220 may have the fourth width L4, and the second warp yarn 210 may have the second width L2. Moreover, it can be understood that in some embodiments, the fourth width L4 may be different from the first width L1, the second width L2, and the third width L3.

Further, in some embodiments, the widths of the second warp yarn and/or the second weft yarn are different from the widths of the first warp yarn and/or the first weft yarn, that is, the widths of the first warp yarn, the first weft yarn, the second warp yarn and the second weft yarn may be different from each other, that is, the first width L1, the second width L2, the third width L3, and the fourth width L4 may be different from each other.

In this embodiment, the weaving direction of the second dielectric layer is rotated by 90° relative to the weaving direction of the first dielectric layer. Specifically, referring to FIGS. 2 and 3, the first warp yarn is weaving in the longitude direction, and the first weft yarn is weaving in the latitude direction, while the second warp yarn is weaving in the latitude direction, and the second weft yarn is weaving in the longitude direction. In some embodiments, before the step of forming the package substrate, the method further comprises: marking the weaving direction of the corresponding fiberglass on the first dielectric layer and the second dielectric layer, respectively.

In some embodiments, before the step of forming the packaging substrate, the method further comprises: forming signal transmission lines on the first dielectric layer or the second dielectric layer, and the signal transmission lines are located between the first dielectric layer and the second dielectric layer. In some embodiments, the signal transmission lines are copper wires, and an etching process is used to form the copper wires on the first dielectric layer or the second dielectric layer. It should be noted that the etching process for forming the copper wires is well-known to those skilled in the art, and will not be repeated here.

In an embodiment, the first dielectric layer 100 and the second dielectric layer 200 are laminated to form the package substrate. In this embodiment, two adjacent dielectric layers use fiberglass of different widths, and the weaving direction of the fiberglass of the second dielectric layer is rotated by 90° relative to the weaving direction of the fiberglass of the first dielectric layer, which can increase covered area by the fiberglass in the package substrate, improve the integrity of the signal transmission lines, make heat distribution of the package substrate more uniform and reduce warpage.

In order to better understand the technical solutions of this specification, the following description will be given with a specific embodiment. The details listed in this embodiment are mainly for ease of understanding and are not intended to limit the scope of protection of this application.

The two adjacent dielectric layers up and down of the inner high-speed signal transmission lines choose the same sequence of dielectric layer materials, and choose different width types of fiberglass (refer to IPC standards), respectively. In this way, the dielectric permittivity, thermal conductivity, and Young's modulus of two woven fiberglass of the same sequence and different widths will not be much different, which facilitates design of electrical, thermal, and mechanical properties of the package substrate. The fiberglass widths of the dielectric layers up and down should be as small as possible, and the difference in distance between the woven fiberglass of the dielectric layers up and down should be as small as possible. Table 1 below shows some types of woven fiberglass in the IPC standard.

TABLE 1

Some types of woven fiberglass according to IPC standards

| Type (Glass style) | Yarn number U.S. Nomenclature | | Count Per inch | | Basic weight | Thickness | | Note |
|---|---|---|---|---|---|---|---|---|
| | Warp | Weft (fill) | Warp | Weft | (g/m²) | mm | mil | |
| 1017 | BC3000 1/0 | BC3000 1/0 | 95 | 95 | 12.3 | 0.014 | 0.53 | IPC SPEC |
| 1027 | BC1500 1/0 | BC1500 1/0 | 75 | 75 | 19.9 | 0.019 | 0.75 | IPC SPEC |
| 1037 | C1200 1/0 | C1200 1/0 | 70 | 73 | 23.0 | 0.027 | 1.1 | IPC SPEC |
| 106 | D900 1/0 | D900 1/0 | 56 | 56 | 24.4 | 0.033 | 1.3 | IPC SPEC |

It can be seen from Table 1 that the warp yarn and weft yarn of some woven fiberglass have the same width, such as type 1017, 1027, 106 in Table 1, while warp yarn and weft yarn of some woven fiberglass have different widths, such as type 1037, and the type 1017, 1027, 1037 and 106 in Table 1 each has different widths of warp yarn or weft yarn. In one embodiment, for example, the first dielectric layer selects type 1017 woven fiberglass, and the second dielectric layer selects type 1037 woven fiberglass. In another embodiment, the first dielectric layer selects type 106 woven fiberglass, and the second dielectric layer selects type 1027 woven fiberglass.

An embodiment of the present application also discloses a package substrate, comprising:
  a first dielectric layer, formed by weaving at least fiberglass of a first width;
  a second dielectric layer, formed by weaving at least fiberglass of a second width, and the second dielectric layer is laminated on the first dielectric layer;
  signal transmission lines, the signal transmission lines are located between the first dielectric layer and the second dielectric layer.

Wherein, the second width is different from the first width, for example, the second width is greater than the first width. In addition, the weaving direction of the fiberglass in the first dielectric layer is 90° relative to the weaving direction of the fiberglass in the second dielectric layer.

In some embodiments, the first dielectric layer comprises a first warp yarn weaving along the latitude direction and a first weft yarn weaving along the longitude direction, while the second dielectric layer comprises a second warp yarn weaving along the latitude direction and a second warp yarn weaving along the longitude direction, wherein the widths of the second warp yarn and/or the second weft yarn are different from the widths of the first warp yarn and/or the first weft yarn.

Another embodiment of the present application also discloses a printed circuit board, the printed circuit board comprises the package substrate formed by the manufacturing method of the packaging substrate as described above, and the package substrate is packaged with an integrated circuit device or a chip, which is used to implement predefined functions.

It should be noted that in the descriptions of the present application, relational terms such as first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also Other elements, or elements that are inherent to such a process, method, item, or device. Without more restrictions, the element defined by the phrase "include one" does not exclude that there are other identical elements in the process, method, article, or equipment that includes the element. In the application file of this patent, if it is mentioned that an action is performed according to an element, it means the meaning of performing the action at least according to the element, and includes two cases: the behavior is performed only on the basis of the element, and the behavior is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification shall be included in the protection scope of one or more embodiments of this specification.

In some cases, the actions or steps described in the claims may be performed in a different order than in the embodiments and still achieve desired results. In addition, the processes depicted in the drawings do not necessarily require the specific order or sequential order shown to achieve the desired result. In certain embodiments, multitasking and parallel processing are also possible or may be advantageous.

What is claimed is:

1. A manufacturing method of a package substrate, comprising:
   forming the package substrate including forming a first dielectric layer by weaving at least fiberglass of a first width and forming a second dielectric layer by weaving at least fiberglass of a second width;
   wherein, the second width is different from the first width, and the weaving direction of the fiberglass in the first dielectric layer is 90° relative to the weaving direction of the fiberglass in the second dielectric layer;
   wherein the forming of the first dielectric layer further comprises the following steps:
      forming a first woven fiberglass by weaving a first warp yarn and a first weft yarn, wherein the first warp yarn is fiberglass of the first width and the first weft yarn is fiberglass of a third width, or the first weft yarn is fiberglass of the first width and the first warp yarn is fiberglass of a third width, wherein the third width is different from the first width and the second width; and
      forming the first dielectric layer by wrapping epoxy on both sides of the first woven fiberglass.

2. The manufacturing method according to claim 1, wherein the forming of the second dielectric layer further comprises the following steps:
   forming a second woven fiberglass by weaving a second warp yarn and a second weft yarn, wherein the second warp yarn and the second weft yarn are fiberglass with the second width; and
   forming the second dielectric layer by wrapping epoxy on both sides of the second woven fiberglass.

3. The manufacturing method according to claim 1, wherein the forming of the second dielectric layer further comprises the following steps:
   forming a second woven fiberglass by weaving a second warp yarn and a second weft yarn, wherein the second warp yarn is fiberglass of the second width and the second weft yarn is fiberglass of a fourth width, or the second weft yarn is fiberglass of the second width and the second warp yarn is fiberglass of a fourth width, wherein the fourth width is different from the first width, the second width, and the third width; and
   forming the second dielectric layer by wrapping epoxy on both sides of the second woven fiberglass.

4. The manufacturing method according to claim 1, wherein the second width is greater than the first width.

5. The manufacturing method according to claim 1, wherein before the step of forming the package substrate, the method further comprises: marking the weaving direction of the corresponding fiberglass on the first dielectric layer and the second dielectric layer.

6. The manufacturing method according to claim 1, wherein before the step of forming the packaging substrate, the method further comprises: forming signal transmission lines on the first dielectric layer between the first dielectric layer and the second dielectric layer or forming signal transmission lines on the second dielectric layer between the first dielectric layer and the second dielectric layer.

7. The manufacturing method according to claim 6, wherein the transmission lines are copper wires, and the forming of the signal transmission lines further comprises: forming the copper wires by etch process on the first dielectric layer or the second dielectric layer.

* * * * *